United States Patent [19]

Weber

[11] Patent Number: 4,896,205
[45] Date of Patent: Jan. 23, 1990

[54] COMPACT REDUCED PARASITIC RESONANT FREQUENCY PULSED POWER SOURCE AT MICROWAVE FREQUENCIES

[75] Inventor: Robert J. Weber, Marion, Iowa

[73] Assignee: Rockwell International Corporation, El Segundo, Calif.

[21] Appl. No.: 317,146

[22] Filed: Feb. 28, 1989

Related U.S. Application Data

[63] Continuation of Ser. No. 73,044, Jul. 14, 1987, abandoned.

[51] Int. Cl.[4] ............ H01L 23/02; H01L 23/32; H01L 27/66
[52] U.S. Cl. ............................ 357/81; 357/13; 357/57; 357/76; 357/77
[58] Field of Search ................. 357/81, 57, 76, 77, 357/13

[56] References Cited

U.S. PATENT DOCUMENTS

| | | | |
|---|---|---|---|
| 3,356,914 | 12/1967 | Whigham et al. | 357/81 |
| 4,339,870 | 7/1982 | Ball et al. | 357/76 |
| 4,504,850 | 3/1985 | Pollarol et al. | 357/81 |

FOREIGN PATENT DOCUMENTS

| | | | |
|---|---|---|---|
| 59-952 | 1/1984 | Japan | 357/81 |
| 2087146 | 5/1982 | United Kingdom . | |

Primary Examiner—Andrew J. James
Assistant Examiner—Ngan Van Ngo
Attorney, Agent, or Firm—Gregory G. Williams; M. Lee Murrah; H. Fredrick Hamann

[57] ABSTRACT

A Compact Reduced Parasitic Resonant Frequency Pulsed Power Source at Microwave Frequencies is disclosed which uses a series of stacked IMPATT diodes with thick metallic heat sinks interposed between each of the IMPATT diodes with the effective heat sink of each heat sink being roughly equivalent to the diode radius in length. The effective heat sink length is matched through the disclosed analysis to the effective heat sink of the base heat sink which is located at the bottom of the stack of IMPATT diodes. The diodes are operated in a pulsed fashion and the effective heat sink length is matched to the effective heat sink of the base heat sink that the temperature of the stacked IMPATT diodes track together in time.

5 Claims, 7 Drawing Sheets

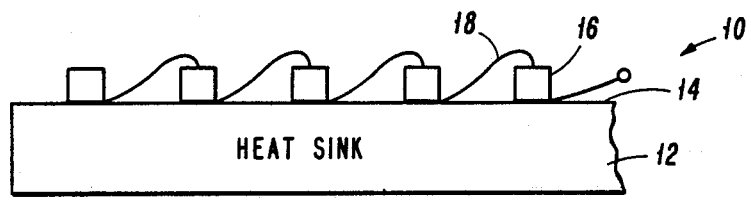
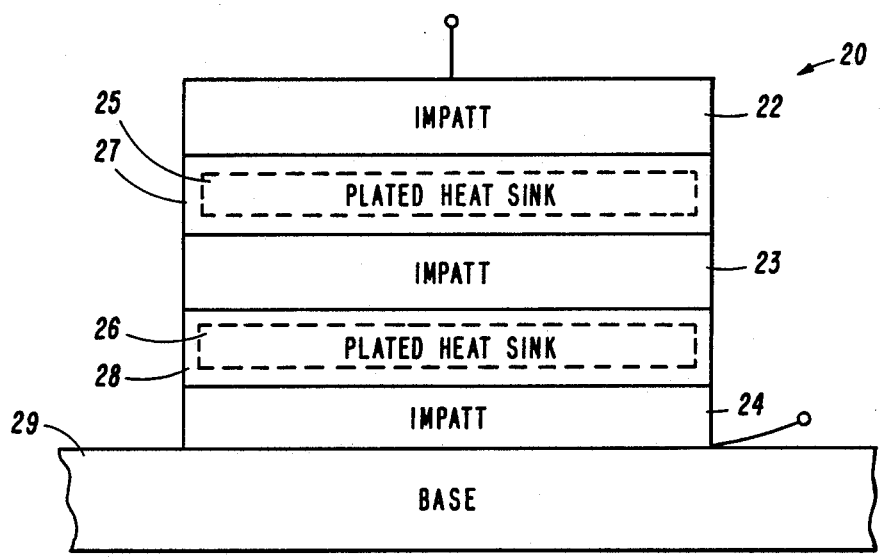
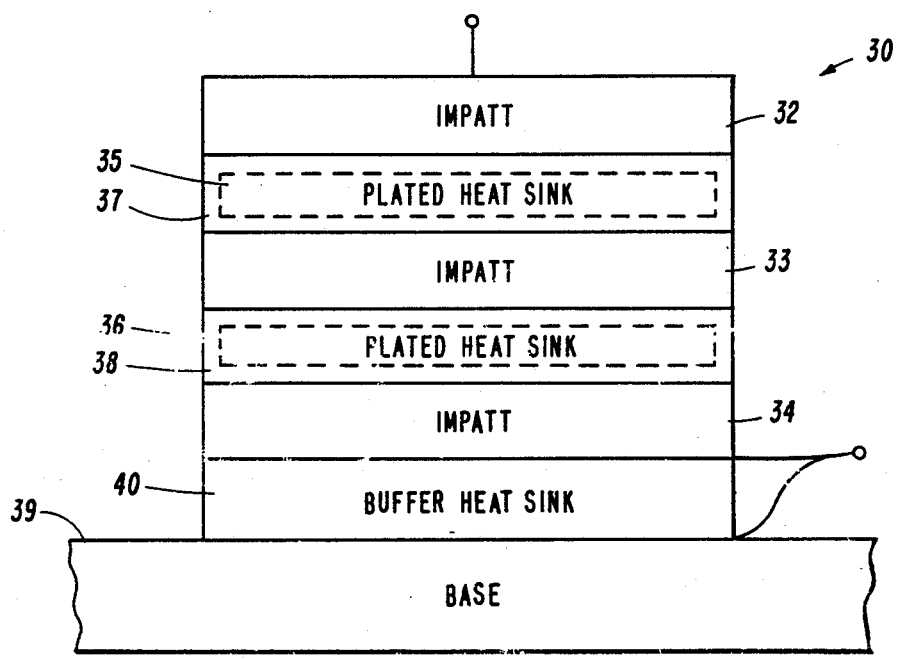

COMPACT REDUCED PARASITIC RESONANT FREQUENCY PULSED POWER SOURCE AT MICROWAVE FREQUENCIES

This Application is a Continuation of Application Ser. No. 07/073,044 filed Jul. 14, 1987, now abandoned.

BACKGROUND OF THE INVENTION

The present invention generally relates to power sources, and more particularly is concerned with power sources for use in pulsed operations at microwave frequencies, which are made by connecting IMPATT diodes electrically and thermally in series.

Impact ionization avalanche transit time (IMPATT) diodes have many uses, but they are best known for their abilities to produce negative resistances and act as reliable solid-state sources of power at microwave frequencies. A similarity in all IMPATT diodes is the fact that they contain at least a single junction between a P-type semiconductor and an N-type semiconductor. Also, when these diodes operate, it becomes necessary to provide a good heat sink nearby to prevent burn-out of the P-N junction. A brief description of the operation, construction and function of IMPATT diodes is given in Sze, *Semiconductor Devices, Physics and Technology*, published in 1985 by John Wiley & Sons, New York, N.Y., in chapter 6.2 at pages 229-234 (inclusive) which is hereby incorporated herein by this reference.

Temperature often affects performance of IMPATT diodes. The temperature characteristics of IMPATT diodes have been the subject of much research, and have been discussed in the following articles which are incorporated herein by this reference: Olson, *Temperature Transients in IMPATT Diodes*, IEEE Electron Devices, Vol. ED-23, No. 5, May, 1976; Olson, *A Mechanism for Catastrophic Failure of Avalanche Diodes*, IEEE Electron Devices, Vol. ED-22, No. 10, Oct. 1975; and Diebold, *Temperature Rise of Solid Junctions under Pulse Load*, AIEE, Vol. 76, Part 1, Communications and Electronics, Nov. 1957.

In some applications, it is desirable to electrically connect several IMPATT diodes in series in order to achieve a certain predetermined power characteristic. Also, in certain applications, the diodes are often not operated in a continuous wave signal mode, but they are subjected to an incident pulsed signal. When considering that diodes, which are connected electrically in series and subjected to a pulsed signal, have junction temperatures constantly varying in time, and further considering the variable performance of IMPATT diodes as a function of temperature, it is frequently desirable to have the temperature of the individual diodes track together in time.

In one arrangement used in the past, several IMPATT diodes were electrically connected in series, and were typically placed thermally in parallel, for example, side by side on a single heat sink. In such configurations, the single heat sink serves each diode equally. The lateral separation between the diodes and the overall size and surface area of the heat sink necessary for proper operation depend upon many factors including the heat generated by the diodes, the heat sink composition, the diode diameter, and the overall environment.

While this method of power generation at microwave frequencies, or variations of it, have enjoyed extensive use in the past, they have several major drawbacks. One problem with arranging the several IMPATT diodes in a parallel thermal configuration is that the then-requisite electrical connections needed to serially connect the separated diodes creates a parasitic resonance in the structure. Furthermore, with the current trend toward miniaturization of electronics equipment, the conventional power source with a single planar heat sink is increasingly less attractive, because such a configuration is often too large and cumbersome.

Consequently, a need exists for improvement in power sources for use at microwave frequencies in pulsed operations, which result in the reduction of parasitic resonance in the structure while concurrently reducing the planar surface area, the overall size and weight of the power source, and concomitantly providing for improved performance by a relative tracking together in time of the temperature of the individual diodes during pulsed operations.

SUMMARY OF THE INVENTION

It is an object of the present invention to provide a microwave power source, so that an overall reduction in the devices parasitic resonance is achieved.

It is a feature of the present invention to electrically and thermally serially connect IMPATT diodes.

It is an advantage of the present invention to greatly shorten the electrical connections between the IMPATT diodes and thereby reduce parasitic resonance.

It is another object of the present invention to reduce the overall size and surface area of the microwave power source.

It is another feature of the present invention to serially stack the IMPATT diodes, and to have interposed between each of the diodes a metallic heat sink.

It is another advantage of the present invention to eliminate the need for a heat sink plane on which individual IMPATT diodes are typically mounted.

The present invention provides a reduced parasitic resonance microwave frequency power source designed to fulfill the aforementioned needs, satisfy the earlier-propounded objects, contain the above-described features, and produce the previously-stated advantages. The invention is carried out by "non-planar" heat sinks in the sense that a single planar heat sink for carrying all the connected IMPATT diodes is not utilized. Instead, the IMPATT diodes are serially stacked on top of each other with heat sinks interposed therebetween. Furthermore, despite the fact that the stacked and thermally serial configuration is taller than the non-stacked thermally parallel configuration, an overall size and weight reduction advantage is achieved. Moreover, the parasitic resonance within the structure is greatly reduced.

Accordingly, the present invention relates to apparatus and method for generating electrical power at microwave frequencies by electrically and thermally connecting, in series, IMPATT diodes. The invention including at least two IMPATT diodes stacked upon one another with a heat sink interposed therebetween.

BRIEF DESCRIPTION OF THE DRAWINGS

The invention may be more fully understood by reading the following description of preferred embodiments of the invention in conjunction with the appended drawings wherein:

FIG. 1 is a somewhat enlarged schematic electronic representation of a power source of the prior art;

FIG. 2 is a greatly enlarged schematic cross-sectional representation of a power source of the present invention;

FIG. 3 is a greatly enlarged schematic cross-sectional representation of an alternative embodiment of the power source of the present invention which contains a buffer heat sink;

DETAILED DESCRIPTION

Figure 4:
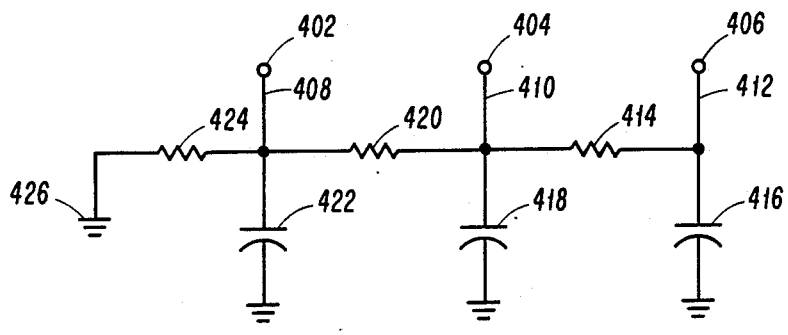
FIG. 4 is a schematic thermal circuit diagram of the power source of this invention.

Referring to the drawings, and more particularly to FIG. 1, there is shown a microwave power source of the prior art generally designated 10, which comprises a single planar heat sink 12 having a top surface 14 for receiving a series of IMPATT diodes 16. The diodes 16 are electrically connected in series by electrical connectors 18. The diodes 16 are thermally connected in parallel to a single heat sink 12, which is sufficiently large so as to have sufficient thermal capacity to receive the thermal energy generated by all of the attached IMPATT diodes.

Figure 15:
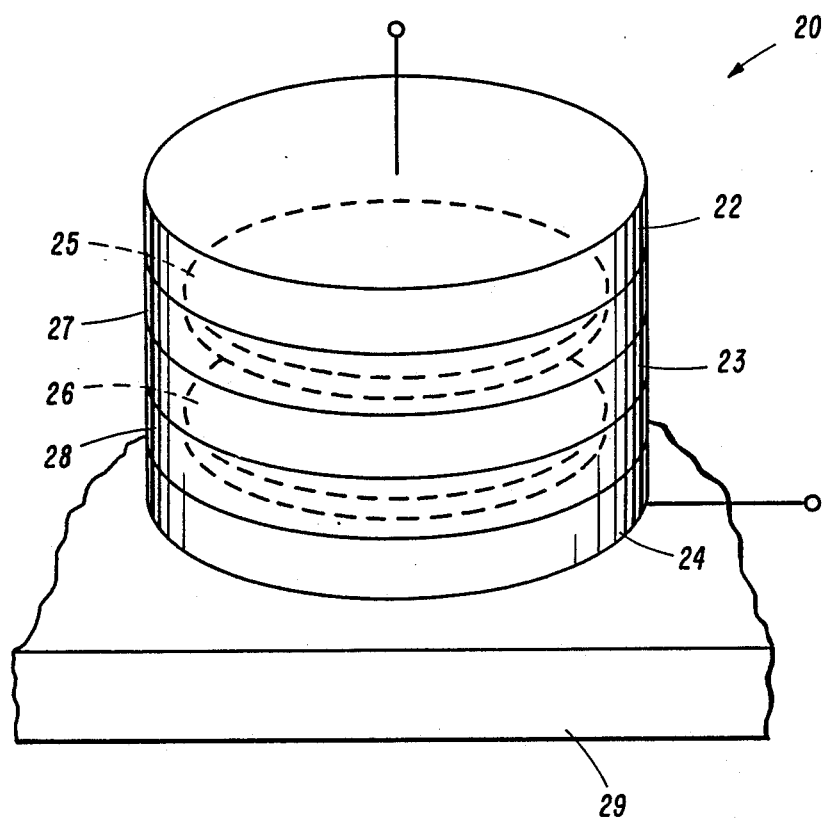
FIG. 15 is a perspective representation of the power source of FIG. 2.

Now referring to FIG. 2, and FIG. 15 there is shown a microwave frequency power source, generally designated 20, which incorporates a preferred embodiment of the present invention. The power source 20 includes a stack of IMPATT diodes 22, 23 and 24 with transitional heat sinks 25 and 26 positioned therebetween. IMPATT diodes 22, 23, 24 are well known in the art and any such diode suitable to the particular power requirements may be used. Heatsinks 25 and 26 are of a high thermal capacity and a high thermal conductivity with respect to the semiconductor material of the IMPATT diodes. In a preferred embodiment, heat sinks 25 and 26 further having a metallic plating 27 and 28 thereon. Gold or a gold-copper alloy is the preferred metallic plating 27, 28 but any suitable material may be substituted. The necessary dimensions of transient heat sinks 25, 26 are variable and depend upon several factors with the duration of the pulse being paramount. In order to keep each die working at the same relative temperature, the off-time between pulses has to be long enough to allow most of the heat generated in the upper diode to propagate to the base heat sink 29.

Now referring to FIG. 3, there is shown a microwave frequency power source, generally designated 30, which incorporates a preferred embodiment of the present invention. The power source 30 includes a stack of IMPATT diodes 32, 33, 34 which are all well-known in the art, and any such diodes suitable to the particular power requirements may be used. Heat sinks 35 and 36 are of a high thermal capacity and a high thermal conductivity with respect to the semiconductor material of the IMPATT diodes 32, 33, 34. In a preferred embodiment, heat sinks 35 and 36 further have a metallic coating 37, 38 thereon. Gold or a gold-copper alloy is preferred metallic plating 37, 38, but any suitable material may be substituted. Copper or a copper alloy is the preferred material for constructing the core of the heat sinks 35 and 36. The necessary dimensions of transient heat sinks 35 and 36 are variable, and depend upon several factors with the duration of the pulse being paramount. In order to keep each die working at the same relative temperature, the off-time between pulses has to be long enough to allow most of the heat generated in the upper diode to propagate to the base heat sink 39. A buffer heat sink 40 may be interposed between the bottom IMPATT diode 34 and the base heat sink 39, with its dimensions and materials being variable depending upon the diode diameter and the pulse lengths and time between pulses. Since the base heat sink 39 will act as an infinite heat sink, it is necessary to match the base heat sink material together with the buffer heat sink material, so that the thermal characteristics of the combination equates to the thermal characteristics of a plated heat sink such as 35 or 36.

Now referring to FIG. 4, there is shown a schematic circuit diagram of the thermal circuit of the power source of this invention. The circuit generally designated 400 is shown having a first heat generating area 402, a second heat generating area 404, and a third heat generating area 406. The heat generating areas 402, 404 and 406 are connected to the remainder of the thermal circuit by thermal connectors, 408, 410 and 412, respectively. The heat generated from the third heat generating area 406 may be conducted away through a thermal resistance 414 or stored in thermal capacitor 416. Likewise the heat generated from the second heat generating area 404 together with the heat conducted through a thermal resistance 414 may be stored in thermal capacitor 418 or be conducted away through the thermal resistance 420. In a similar fashion, heat generated from the first heat generating region 402 together with the heat conducted through the thermal resistance 420 can either be stored in the heat capacitor 422 or conducted away to the base heat sink 426 through thermal resistance 424.

Theory of the invention

While not wishing to be bound by theory, it is believed that the advantageous results of the invention are obtained because of the following reasons detailed in the following theoretical analysis.

Several authors have recognized the need to do a pulse analysis of the thermal behavior of semiconductor junctions. As early as 1957, Diebold studied the problem using essentially a finite element approach. For an in-depth analysis, see, the E. J. Diebold article entitled "Temperature Rise of Solid Junctions under Pulse Load", in the *Trans. A.I.E.E. Part I Communications and Electronics*, pp. 593–598, Nov. 1957. A paper by Olson gives an analysis of work done up to 1976. For additional information, see the H. M. Olson article "Temperature Transients in IMPATT Diodes", in the *IEEE Transactions on Electron Devices*, pp 494–503, May 1976. Olson also looked at the transient pulse behavior of IMPATT diodes. He used a multiple R-C section approach. It is unclear how he gets his transient heat sink analysis from a steady state heat sink analysis. He uses pulse analysis in the time domain for his theoretical calculations and an IBM program (ASTAP) for the computer calculations.

This analysis uses Fourier series analysis in combination with a distributed transmission line approach. This approach differs from Olson's by requiring a summation in the frequency domain. Since multiple chips will be considered, superposition will be carried out both in the frequency domain and for each node. Non-linear effects such as the thermal resistance which change with temperature, etc., could be included. However, a worst case analysis is done using values for these parameters at the highest temperature anticipated.

The diode structure considered is shown in FIGS. 2 and 3. Multiple die are analyzed, each consisting of a diffusion region, a junction region and a substrate region. This stack of die is mounted on an "infinite heat sink". The spreading resistance of the heat sink is considered analytically and used in the calculations.

Isothermal planes are assumed to exist within the die structure. This reduces the problem to a one dimensional problem within the stack. As will be discussed in the spreading resistance section, this is a good approximation since the calculation is based on the worst case temperature. For die which have filaments of current rather than a uniform current density, this analysis will be in error. However, die that generate filaments of current will fail due to the non-linear thermal resistance of semiconductors or semiconductor defects. For further details see H. M. Olson's article entitled "A Mechanism for Catastrophic Failure of Avalanche Diodes", in the *IEEE Transactions on Electron Devices*, pp. 842-849, Oct. 1975.

The thermal behavior of the IMPATT diode will be considered using a one dimensional transmission line model. The thermal source will be considered a circular flat plate. This source is considered to be stacked onto cylinders to conduct the heat away. The electrical model used is:

| ELECTRICAL | THERMAL |
| --- | --- |
| V = Voltage | Temperature = $\theta$ |
| I = Current | Heat Flow = Q |
| 1/R = Conductance | Conductivity = K |
| C = Capacity | Specific Heat $\times$ Density = $\rho C$ |

Figure 12:
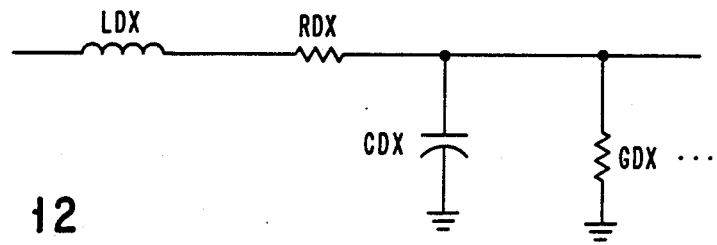
FIG. 12 is a schematic diagram of a lossy transmission line where the inductance, resistance, capacitance, and conductance are a function of the length X.

Consider a lossy transmission line of FIG. 12, where:

| ELECTRICAL | THERMAL |
| --- | --- |
| L = Inductance/unit length | Phonon effects of heat delay |
| R - Resistance/unit length | Thermal resistance/unit length |
| C = Capacitance/unit length | Thermal capacity/unit length |
| G = Conductance/unit length | 1/(Radiation resistance) unit length |

Figure 13:
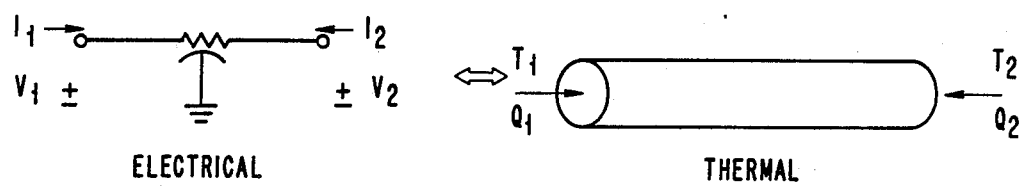
FIG. 13 is a schematic representation of a thermal delay line and its analogous electrical delay line.

For no radiation and ignoring optical and phonon effects, the resultant delay line is shown in FIG. 13. The transmission line propagation constant is:

$$\gamma = ((R + j\omega L)(G + j\omega C))^{1/2} \quad L = G = 0$$
$$= (j\omega CR)^{1/2}$$

The transmission line characteristic impedance is:

$$Z = \frac{(R + j\omega L)^{1/2}}{(G + j\omega C)^{1/2}} \quad L = G = 0$$
$$= \frac{(R)^{1/2}}{(j\omega C)^{1/2}}$$

Note that both Y and Z are frequency dependent.

For each different material a different transmission line segment is needed. A solution for a composite diode requires the solution of a multiple transmission line problem. The Y or admittance matrix for a dispersive transmission line is:

$$Y = Y_o \begin{pmatrix} \coth(\gamma l) & -\operatorname{csch}(\gamma l) \\ -\operatorname{csch}(\gamma l) & \coth(\gamma l) \end{pmatrix}$$

Matrix Development

Figure 6:
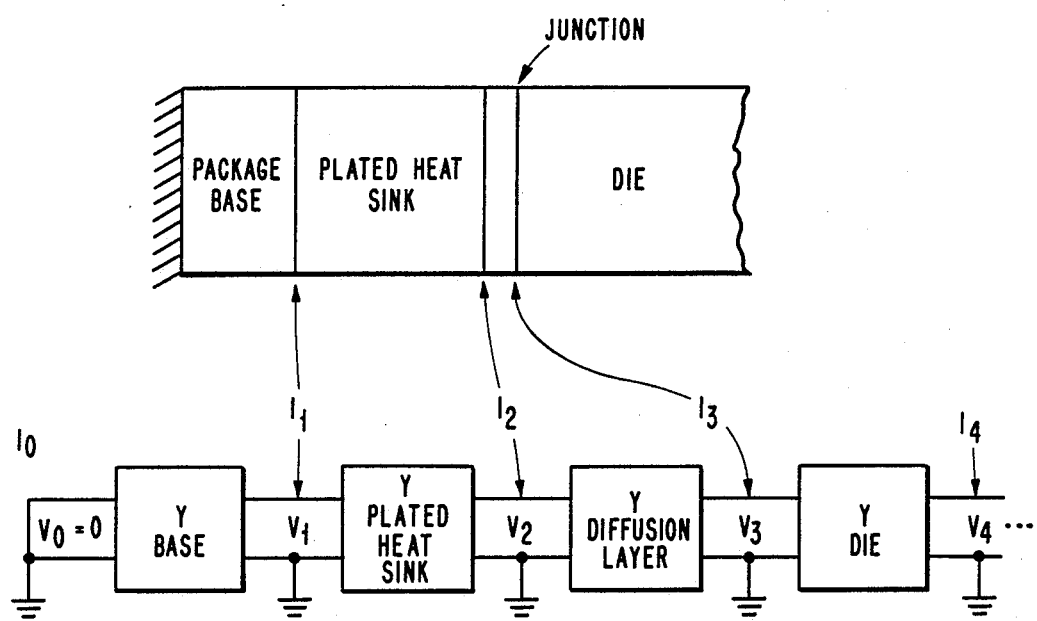
FIG. 6 is a schematic representation of the power source of the present invention together with its associated admittance matrix model.
Figure 14:
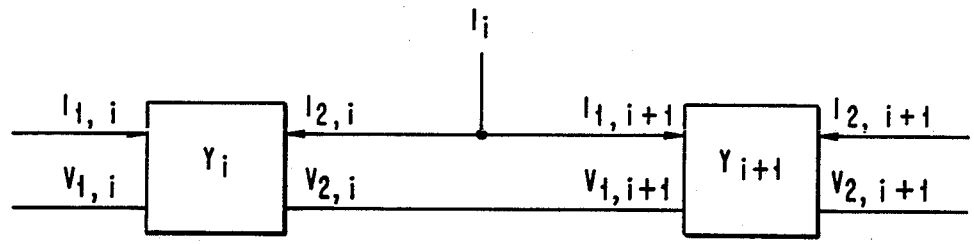
FIG. 14 is a schematic representation of two linear admittance matrices to be viewed in conjuction with FIG. 6.

The Y matrix for the composite structure shown in FIG. 6 is tridiagonal and diagonally dominant. Consider two Y matrixes of FIG. 14:

Let:

$$I_i = I_{1,i+1} + I_{2,i} \quad i = 1, \ldots, n-1$$

$$V_{1,i+1} = V_{2,i} = V_i \quad i = 1, \ldots, n-1$$

$$V_i = \text{composite node voltages}$$

$$I_{1,i+1} = Y_{11,i+1}V_{1,i+1} + Y_{12,i+1}V_{2,i+1}$$

$$I_{2,i+1} = Y_{21,i+1}V_{1,i+1} + Y_{22,i+1}V_{2,i+1}$$

$$I_{1,i} = Y_{11,i}V_{1,i} + Y_{12,i}V_{2,i}$$

$$I_{2,i} = Y_{21,i}V_{1,i} + Y_{22,i}V_{2,i}$$

$$\begin{aligned} I_i &= I_{2,i} + I_{1,i+1} \\ &= (Y_{11,i+1} + Y_{22,i})V_i + Y_{12,i+1}V_{i+1} + \\ & \quad Y_{21,i}V_{i-1}; i = 1, \ldots, n-1 \end{aligned}$$

$$I_o = I_{1,1} = Y_{11,1}V_{1,1} + Y_{12,1}V_{2,1} = Y_{11,1}V_0 + Y_{12,1}V_1$$

$$I_n = I_{n,2} = Y_{21,n}V_{1,n} + Y_{22,n}V_{2,n} = Y_{21,n}V_{n-1} + Y_{22,n}V_n$$

Therefore:

$$\begin{bmatrix} I_0 \\ I_1 \\ I_2 \\ \vdots \\ I_n \end{bmatrix} = \begin{bmatrix} Y_{11,1} & Y_{12,1} & 0 & 0\ldots & 0 & 0 \\ Y_{21,1} & Y_{22,1} + Y_{11,2} & Y_{12,2} & 0\ldots & 0 & 0 \\ 0 & Y_{21,2} & Y_{22,2} + Y_{11,3} & Y_{12,3}\ldots & & \\ & & & & & \\ 0 & 0 & \ldots & & Y_{21,n} & Y_{22,n} \end{bmatrix} \begin{bmatrix} V_0 \\ V_1 \\ V_2 \\ \vdots \\ V_n \end{bmatrix}$$

If $V_0 = 0$ (for this analysis it will be), then the resultant Y matrix will have the first row and column eliminated and the order of the Y matrix will be n. The matrix is still tridiagonal and diagonally dominant. A simple Gauss elimination scheme will solve this system of equations, as discussed by D. Greenspan in the article entitled "Discrete Numerical Methods in Physics and Engineering", *Academic Press*, p. 10, 1974.

Since the Y matrix is assumed to be linear, superposition can be used to solve for the response of the circuit to multiple inputs. Linearity was assumed when the individual matrices were merged into the overall matrix. The Y matrix is dispersive (frequency dependent due to the dispersive transmission line) but superposition of frequency components is valid in transmission line problems just as it is in other types of circuits.

A Fourier series is used to calculate the response of the circuit to pulse inputs. The Fourier series for a pulse of a cosine wave of width $2t_\alpha$, frequency $\omega=2\pi f$, and period T is:

$$f(t) = \frac{2t_\alpha}{T} + \frac{4t_\alpha}{T} n = 1 \frac{\sin\left(\frac{2\pi n t_\alpha}{T}\right)}{\frac{2\pi n t_\alpha}{T}} \cos\frac{(2\pi n t)}{T}$$

Since $t_{60} << T$ for a low duty factor (e.g. 1 percent), a large number of terms are needed to determine the characteristics of the pulse. In order to get the fidelity of the pulse equal to the fidelity of ten harmonics of an equivalent square wave:

$$2\pi n t_\alpha/T \simeq 2\pi\ 10/4 \quad (T = 4t_\alpha)$$

$$n \simeq 5T/2t_\alpha = 5/D.F. \text{ where } D.F. = \text{duty factor.}$$

The velocity of the thermal wave for each frequency is:

$$\beta = \omega/v = (\omega CR/2)^{1/2}$$
$$v = (2\omega/CR)^{1/2} = 2\ (\pi n/(TCR))^{1/2}$$

Figure 7:
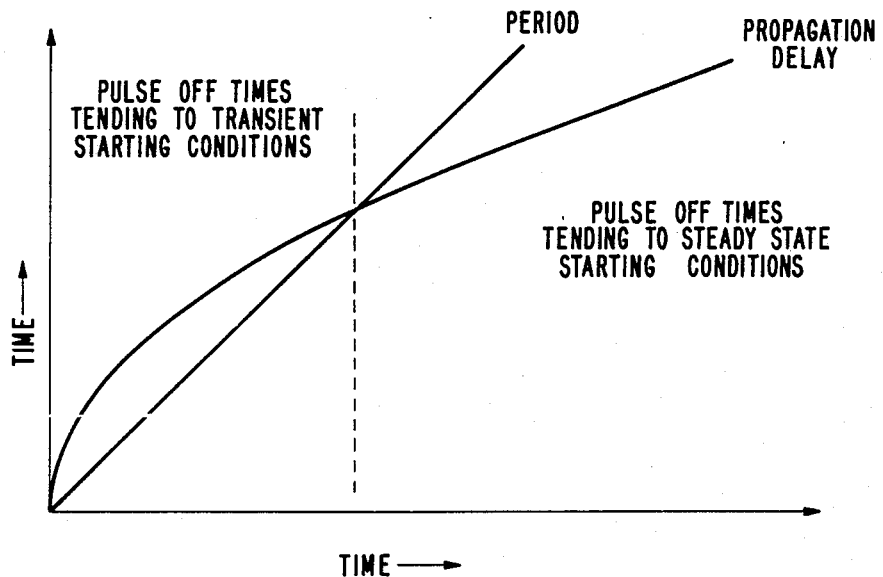
FIG. 7 is a graphic representation of the delay time plotted versus the period for a fixed $l_0$.
Figure 8:
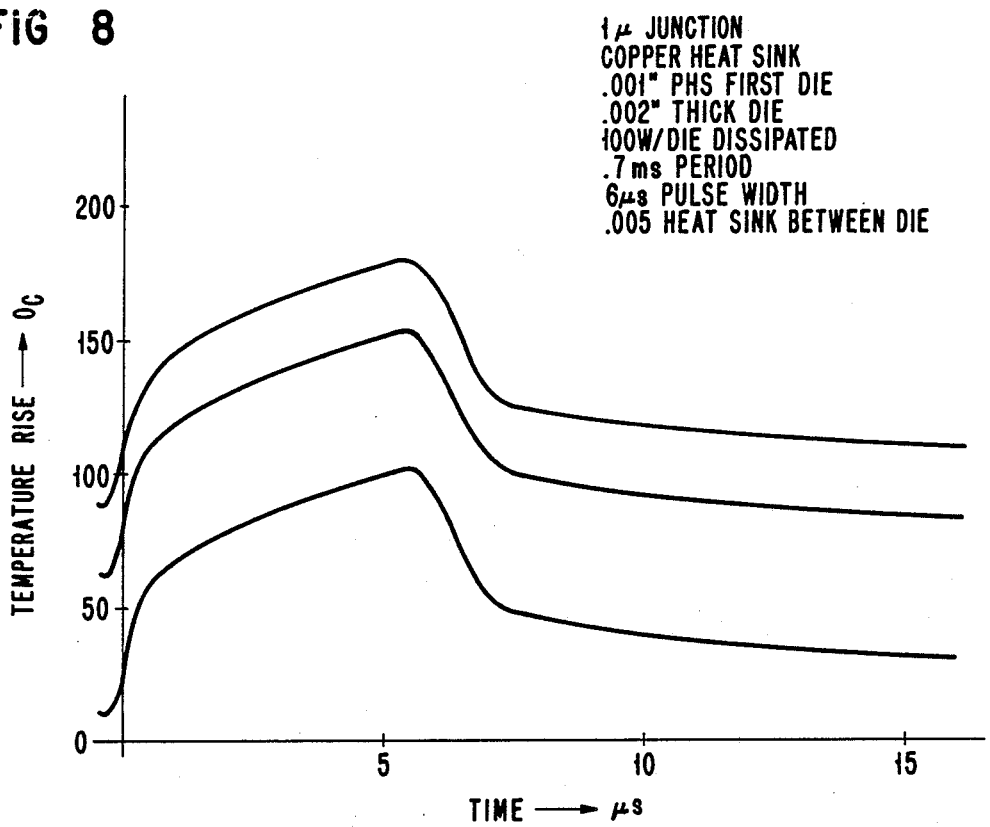
FIGS. 8, 9, 10 and 11 are graphic representations of temperature rise versus time in several different applications of power sources of the present invention.
Figure 9:
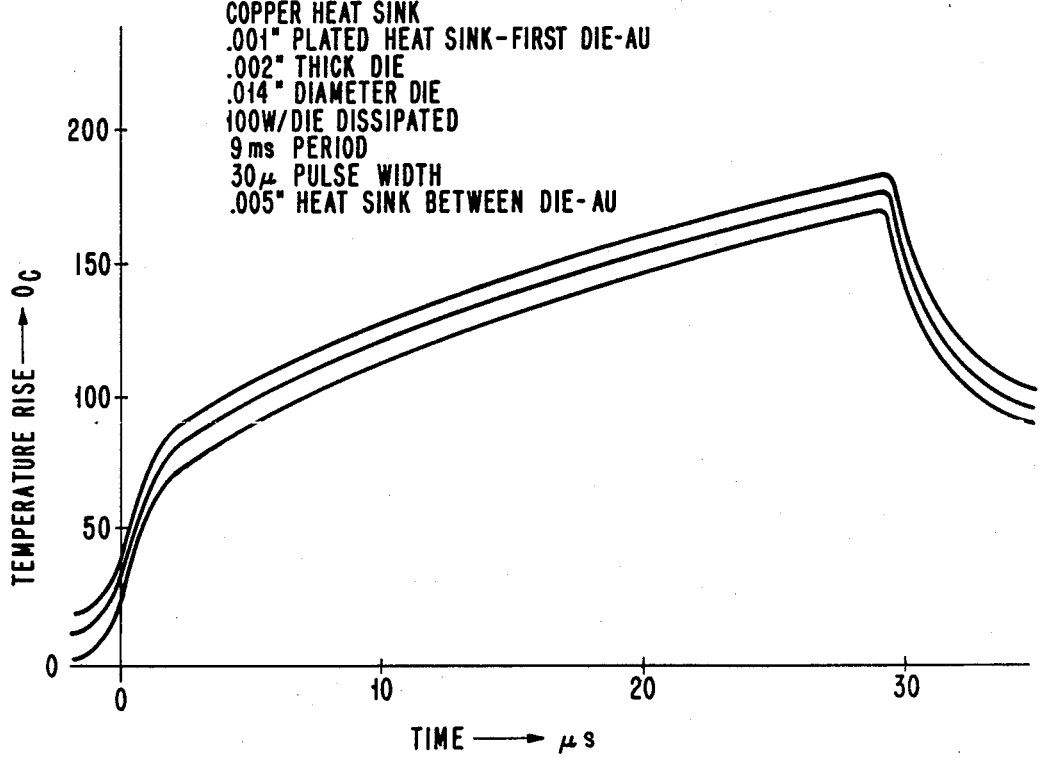
Figure 10:
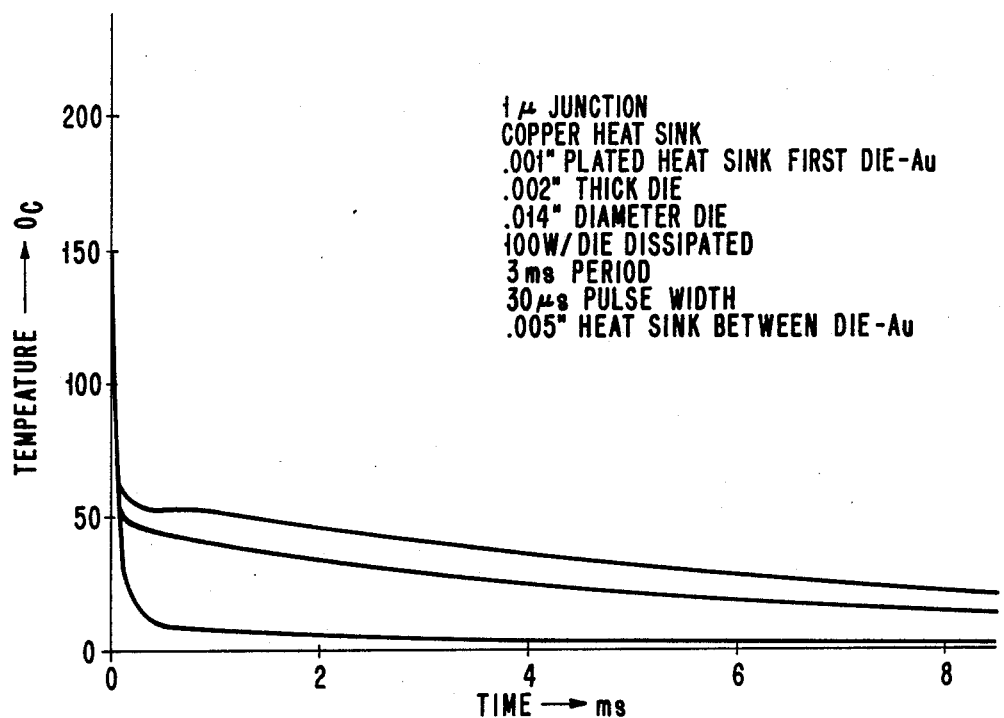
Figure 11:
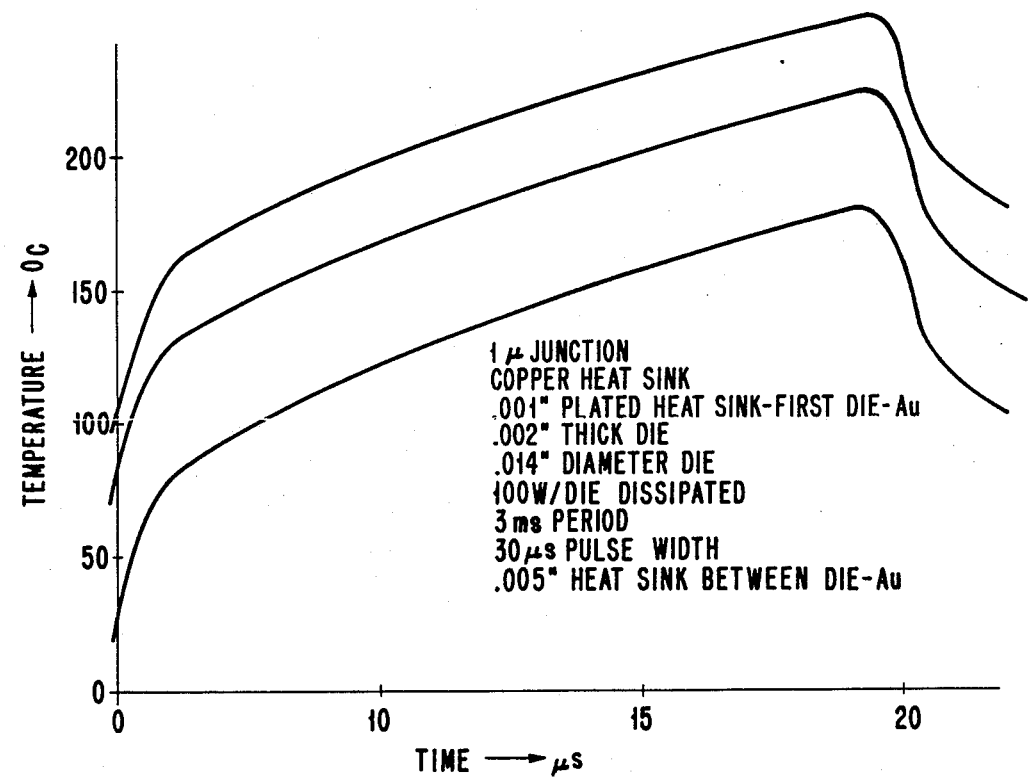

Note that the slowest velocity other than the D.C. term is for $\omega=2\pi/T$. As the period increases, $\omega$ decreases. Let:

$$t_d = l_0/v_l$$

where $t_d$=delay for the lowest thermal harmonic
$l_0$=length to heat sink
$v_l$=velocity of lowest thermal harmonic.
FIG. 7 shows a plot of $t_d$ versus T for a fixed $l_0$.

For $t_d = T - 2t_\alpha \simeq T$ $T = l_0\ (TCR/\pi)^{1/2}/2$ $(T)^{1/2} = l_0\ (CR/\pi)^{1/2}/2$ $T = l_0^2\ CR/4\pi$ or $l_0 = (T4\pi/CR)^{1/2}$ when $t_d = T$ $\alpha l_0 = \beta l_0 = 2\pi$ then:

$e^{-\alpha l_0} = .00186$

For T greater than $l_0^2 CR/4\pi$, only the D.C. term has a propagation time longer than T. However, multiple reflections of the wave will occur for lengths much shorter than $l_0$. Since $1 << l_0$, the wave will not have attenuated very much.

|  | $l_0 \leq (T4\pi/CR)^{\frac{1}{2}} = (T4\pi K/\rho c)^{\frac{1}{2}}$ |
|---|---|
| For Si: | $l_0 \leq (T)^{\frac{1}{2}} \times\ 847$ mil at 250° C. |
| GaAs: | $l_0 \leq (T)^{\frac{1}{2}} \times\ 511$ mil at 250° C. |
| Au: | $l_0 \leq (T)^{\frac{1}{2}} \times 1564$ mil at 25° C. |
| Copper: | $l_0 \leq (T)^{\frac{1}{2}} \times 1500$ mil at 25° C. |
| Diamond: | $l_0 \leq (T)^{\frac{1}{2}} \times 3298$ mil at 125° C. |

Doped semiconductor values will yield slightly lower values. Because multiple reflections take place in a diode structure, the wave must be analyzed with transmission line theory.

Spreading Resistance

The last component of the structure to be derived is the spreading resistance. The steady state value for a constant temperature disk on an infinite heat sink is well known. However, it is not immediately clear how this applies to the periodic sources case. Additionally, a disk on an infinite heat sink will likely be producing a uniform heat flux rather than be at a constant temperature. The steady state average value of this spreading resistance is also well known, as shown in the book entitled "Conduction of Heat in Solids" by H. S. Carslow and J. C. Jaeger, published in *London Oxford*, p. 216, 1959. These are:

$$R_s = 1/(4Ka) = 0.25/(Ka) \text{ constant temperature} \quad (1)$$

$$R_{s,\ av} = 8/(3\pi^2 Ka) = 0.27/(Ka) \text{ uniform flux of heat} \quad (2)$$

Where a is the radius of the disk.

It will be shown that the peak temperature for the spreading resistance for a uniform heat flux is:

$$R_{PK} = 1/(\pi Ka) = 0.318/(Ka) \quad (3)$$

The peak value is used in these calculations. This value occurs at the center of the die. It should be noted that the form of spreading resistance No.1, above, results in a singularity of heat flux at the circumference of the die. The assumptions connected with Formula No. 2 above are probably more accurate, although yielding a non-planar isothermal surface at the heat sink.

Swan et. al. have used the constant temperature spreading resistance of Formula No. 1. For additional information, see their article entitled "Composite Avalanche Diode Structures for Increased Power Capacity", published in the *IEEE Transactions on Electron Devices*, pp. 584–589, Sept. 1967. Their analysis is for steady state only.

Low Frequency Analog

Before the transient solution is presented, an approximate solution will be derived valid for steady state. Consider the form of the spreading resistance equations. If one assumes that the spreading resistance is another transmission line of radius a, an equivalent length can be calculated for that line:

$$R_{eff} = l_0/(\pi a^2 K) = \text{length/(area} \times \text{conductivity)}$$

Using the peak value from spreading resistance three:

$$R_{pk} = 1/(\pi Ka) = l_0/(\pi a^2 K)$$

implies $l_0 = a$

Therefore in the steady state, the spreading resistance effect can be considered to be a cylinder of diameter "$2a$" height "$a$" placed on an infinite heat sink with no spreading resistance.

Per Unit Spreading Resistance

Note that the steady state spreading resistance decreases only as $r^{-1}$. Let the incremental thermal resistance per unit area of a cylinder be:

$r_c = l_0/K = R\pi a^2$ for cylinder resistance $r_s = \pi a^2/\pi K a = a/K$ for spreading resistance $r_t = r_c + r_s = l_0/K + a/K = (l_0 = a)/K$ The temperature of a junction at the top of the cylinder on a heat sink will then be:

$\theta = (q/K)(l_0 + a)$ where q is the per unit heat generated at the top of the cylinder (e.g., junction of a diode). The larger the radius of the die the higher the temperature is for steady state conditions. For further detail, see the C. B. Swan et al article entitled "Composite Avalanche Diode Structures for Increased Power Capacity", published in the *IEEE Transactions on Electron Devices*, Sept. 1967, at pp. 585–589.

However, for pulse conditions, this analysis is considerably altered. The presence of the thermal capacity of the heat sink alters these conditions.

Periodic Source Spreading Resistance

For the following analysis, refer to a thermal text such as *Conduction of Heat in Solids*, by H. S. Carslow and J. C. Haeger, published by London Oxford in 1959, especially p. 216. The temperature resulting from an instantaneous point source of value Q in an infinite medium is:

$\theta = (Q_0/8pc(\pi kt)^{3/2})\exp(-r^2/rkt)$ where
$\theta$ = temperature,
t = time,
r = distance from the instantaneous pint source, and
k = K/pc.

Assume now that many instantaneous sources occur in time such that the source is:

$Q(t) = Q_0 e^{j\omega t}$

At any point in time the temperature is then:

$$\theta(t,r) = (Q_0/(8\rho c (\pi k)^{3/2})) \int_{-\infty}^{t} e^{j\omega t} e^{-r^2/(4k(t-\lambda))}/(t-\lambda)^{3/2} d\lambda$$

$$= (Q_0/(4\rho c \pi k r)) e^{j\omega t} e^{-(1+j)(\omega/2k)^{1/2}r}$$

by convolution.

Now consider an ensemble of periodic point sources arranged on a disk of radius a. Let $Q_0 e^{j\omega t} = Q_r e^{j\omega t} r \, dr \, d\phi / \pi a^2$ for each incremental area.

The temperature at any point due to a disk of periodic sources is then:

$$\theta = \int_0^a \int_0^{2\pi} \frac{Q_r e^{j\omega t} e^{-(1+j)(\omega/2k)^{\frac{1}{2}}r - r'}r' dr' d\phi'}{4\rho c \pi^2 a^2 k \, r - r'}$$

where $r - r' = (r^2 + z^2 + r'^2 - 2rr'\cos(\phi - \phi'))^{1/2}$, where the prime terms are the integration variables. This integral is difficult to evaluate. A closed form solution is not known. However, at $r = 0$, $\phi$ anything, and $z = 0$ it reduces to:

$$\theta = \frac{Q_0 e^{j\omega t}}{2\pi a^2 \rho c k (1 + j)} ((2k/\omega)^{\frac{1}{2}})(1 - e^{-(1+j)(\omega/2k)^{\frac{1}{2}}a})$$

The temperature is highest at $r = 0$ for steady state values.

For a semi-infinite heat sink, by symmetry, the temperature at the center of the disk is:

$$\theta = \frac{Q_0 e^{j\omega t}}{\pi a^2 \rho c k (1 + j)} ((2k/\omega)^{\frac{1}{2}})(1 - e^{-(1+j)(\omega/2k)^{\frac{1}{2}}a})$$

Sine $\rho ck = K$, heat sink thermal impedance is then:

$$Z(\omega) = \theta/Q = \frac{1}{\pi a^2 K (1 + j)} ((2k/\omega)^{\frac{1}{2}})(1 - e^{-(1+j)(\omega/2k)^{\frac{1}{2}}a})$$

This equation is used in the computer calculations whenever a lumped constant impedance is called for.

To evaluate Z for $\omega = 0$ requires a limiting process. It can be shown that:

$Z(\omega) = 1/(\pi a k)$
$\omega \to 0$

Expanding the exponential term gives:

$$Z(\omega) = \theta/Q = \frac{1}{\pi a^2 K(i + j)} (2k/\omega)^{\frac{1}{2}} \left[ 1 - 1 + (1 + j)(\omega/2k)^{\frac{1}{2}}a - \frac{(1+j)^2}{2!}(\omega/2k)a^2 + \ldots \right]$$

$$= \frac{1}{\pi a K} \left[ 1 - \frac{(1+j)}{2!}(\omega/2k)^{\frac{1}{2}}a + \frac{(1+j)^2}{3!}(\omega/2k)a^2 - \ldots \right]$$

Recall that the low frequency analog of the spreading resistance was a cylinder of radius a and length a. The thermal impedance of this ideal cylinder on an ideal infinite heat sink is:

$$Z_{tl} = Z_o \tanh(\gamma l)$$

$$= (2k/\omega) \frac{1}{K\pi a^2(1-j)} \tanh(1+j)(\omega/2k)^{\frac{1}{2}}a)$$

$$= \frac{1}{K\pi a}\left[1 - \frac{(1+j)^2}{3}(\omega/2k)a^2 + \frac{2(1+j)^4}{15}(\omega/2k)^2a^4 - \ldots\right]$$

Note that this is only valid at DC and starts to diverge as $\omega$ increases.

Alternate Integral Representations

Instead of integrating from a point periodic source, the temperature can be expressed as a time integral of the temperature distribution from an instantaneous disc source at t=0. The instantaneous disc source has:

$$\theta = \frac{Q}{2(\pi kt)^{\frac{1}{2}}\pi a^2 \rho c} e^{-z^2/4kt} \int_0^\infty e^{-kt\lambda^2} J_0(\lambda r) J_1(\lambda a) d\lambda$$

For a periodic source then $$\theta = \int_{-\infty}^{t} \frac{Q_o e^{j\omega\delta} e^{\frac{-z^2}{4k(t-\delta)}}}{2(\pi k)^{\frac{1}{2}}(t-\delta)^{\frac{1}{2}}} \int_0^\infty e^{-k(t-\delta)\lambda^2} J_0(\lambda r) J_1(\lambda a) d\lambda d\delta$$

A solution to the Bessel function integral which is related to the integral referred to as Weber's integral in G. N. Watson's *A Treatise on the Theory of Bessel Functions*, published by Cambridge, Edn. 2, 1944 is not known.

Integrating in (x,y) coordinates where r' could be replaced by x for clarity:

$$Q_{z=0} = \int_{-\infty}^{t} \int_{-a}^{a} \frac{e^{j\omega t}e^{(-r^2-r'^2)}erf^2\left[\frac{a^2-r'^2}{4k(t-\delta)}\right]}{4\pi k(t-\delta)} dr' d\delta$$

Calculation Procedure

The Y matrix is complex. The source current (heat) is assumed to be a periodic function of time.

$$I = Re(I_o e^{j\omega t})$$

The voltage is then:

$$V = Re \frac{[I_o e^{j\omega t}]}{Y(\omega)}$$

A node voltage (temperature) is the result of that due to each node source current. Each node source current is the sum of the harmonics.

$$V_k = \sum_{\text{Node}=1}^{n} \sum_{\text{Harmonic}=0}^{m} Z_{k,n,n} I_{n,m}$$

The y matrix is first calculated, then the matrix is inverted for each time increment desired. Then another y matrix is calculated for the next harmonic number and the y matrix is inverted for each time increment, etc. If variable parameters were used, due to a non-linear y matrix, the first summation would have to be over all harmonics at a give time. This would increase computation time due to having to recalculate the y matrix each time.

Computer Program Flow Chart

Figure 5:
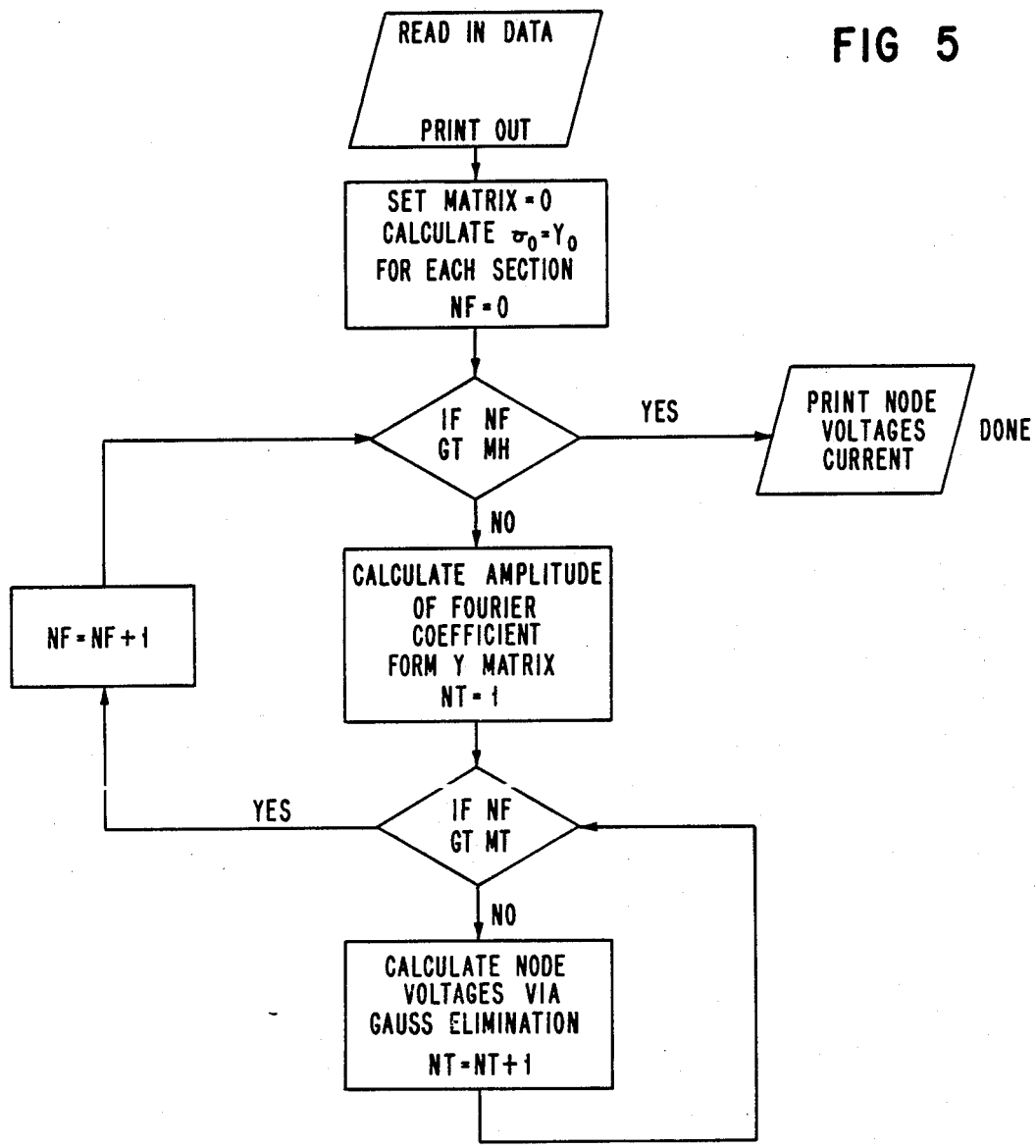
FIG. 5 is a schematic representation of a flow diagram of a program which may facilitate the analysis of the variable parameter selection.

A computer program has been written which does the calculations based on the previous discussion. A flow chart of the program is shown in FIG. 5.

Multiple Die Analysis

In order to provide each die with a similar pulse heat sink capability, a thick metallic heat sink can be inserted between each die. The bottom dice has an effective heat sink of about the die radius in length. This combination gives each die almost an identical transient heat sink. However, the upper die have a much longer thermal path to the heat sink in the steady state. In order to keep each die working at the same temperature, the off time between pulses has to be long enough to allow the heat stored in the upper die to propogate to the heat sink. This characteristic is shown in FIGS. 8, 9, 10 and 11. The die were similar to Varian 15W die. Note that the transient behavior of the thermal rise across the pulse is similar for the 1 percent duty factor case and the 0.33 percent duty factor case. For the 1 percent duty case the temperature starts at a markedly different value for each die.

| Data Entry | |
|---|---|
| Period - Seconds | |
| Pulse Width - Seconds | |
| Number of sections - integer* | max = 25 |
| Number of harmonics - integer | max = "cost !" |
| Number of time steps - integer | max = 100 |
| Start time - seconds | |
| Time increment - Seconds | |
| Current Array - Amps (Watts) | |
| Resistance Array - Ohms/length | |
| Capacitance Array - Farads/Length | |
| Length Array - Length consistent with above | |
| Put either TRAN or LUMP in column 1-4** | |

**TRAN uses the transmission line equivalent for spreading R.

If "time increment" was negative, put in an array of time values for which you want the analysis done.

For section 1, calculate R and C just as if it were the same as a transmission line with a radius A and length A.

In accordance with the foregoing theoretical description, it has been demonstrated that a compact reduced parasitic resonant frequency pulsed power source at microwave frequencies with a power in excess of 50 watts can be obtained in a stacked configuration. While it is conceivable that numerous alterations or minor variations may be substituted, it is preferred that in such power source implementations utilizing stacked IMPATT diodes with heat sinks therebetween, the plated heat sink die be a gold-plated copper and be of the thickness preferably around 0.001 inches, but anywhere in the range of 0.0001 inches to 0.005 inches is also contemplated. The thickness of the thick die of 0.002 inches is preferred, while a range of 0.001 inches to 0.010 inches is also contemplated. A die diameter of 0.014 inches is preferred, while a die diameter ranging from 0.005 to 0.05 inches is also contemplated.

When the power source is operated with a period of 0.7 milliseconds or within a range of 0.5 milliseconds to 0.8 milliseconds, the pulse width of 6 microseconds is preferred, while a range of pulse widths from 0.5 microsecond to 15 microseconds is contemplated. When the power source is operated with a period near 9 milliseconds or within a range between 8 milliseconds and 15 milliseconds, it is preferred that the pulse width be 30 microseconds or within the range of 0.5 microseconds to 50 microseconds. When the power source of this invention is operated with a period of 3 milliseconds or within range of 1 millisecond to 5 milliseconds, it is preferred that the pulse width be 30 microseconds or within the range of 0.5 microseconds to 50 microseconds.

In all the implementations of this invention, it is preferred that the heat sinks between die are gold-plated copper, but other compositions are contemplated including gold-plated diamond, having a thickness of 0.005 inches, or falling within a range from 0.001 inches to 0.009 inches. Also, the IMPATT dies used herein are preferred to be gallium arsenide (GaAs), however, various other semiconductors and other IMPATT diode configurations may be substituted.

It is thought that the compact reduced parasitic resonant frequency pulse power sources at microwave frequencies of the present invention, together with the method for using such power sources, and many of their attendant advantages, will be understood from the foregoing description, and it will be apparent that various changes may be made in the form, construction, and arrangement of the parts and the steps thereof, without departing from the spirit and scope of the invention, or sacrificing all of their material advantages, the form hereinbefore described being merely preferred or exemplary embodiments thereof.

I claim:

1. A microwave frequency power source comprising:
   a. a plurality of cylindrical IMPATT diodes, each having a diameter dimension and connected in an electrical series, for increasing the power output of said plurality with respect to the power of the individual IMPATT diodes within said plurality;
   b. at least one cylindrical intermediate heat sink interposed between said plurality of IMPATT diodes and having a thermal conductivity characteristic and a thermal capacity characteristic and a diameter dimension;
   c. wherein said plurality of IMPATT diodes and said at least one intermediate heat sink being arranged in a stack with said stack having an end;
   d. wherein said IMPATT diodes and said at least one intermediate heat sink have equal diameter dimensions; and
   e. a base heat sink, positioned in a stacked configuration at the end of said stack, said base heat sink having a thermal conductivity characteristic and a thermal capacity characteristic wherein the thermal conductivity characteristic and thermal capacity characteristic of said at least one intermediate heat sink is matched to the thermal conductivity characteristic and thermal capacity characteristic of said base heat sink.

2. A microwave frequency power source of claim 1 wherein said at least one heat sink further comprises a copper alloy plated with a thin film of gold.

3. A microwave frequency power source of claim 2 wherein said thin film of gold further comprises a thin film within the range of 0.0005 inches to 0.002 inches.

4. A microwave frequency power source of claim 3 wherein said plurality of IMPATT diodes further comprises a plurality of gallium arsenide (GaAs) IMPATT diodes.

5. A microwave frequency power source comprising:
   a. a plurality of cylindrical IMPATT diodes, each having a diameter dimension connected in an electrical series, for increasing the power output of said plurality with respect to the power of the individual IMPATT diodes within said plurality;
   b. at least one cylindrical intermediate heat sink having a diameter dimension interposed between said plurality of IMPATT diodes;
   c. wherein said plurality of IMPATT diodes and said at least one heat sink being arranged in a stack with said stack having an end;
   d. wherein said IMPATT diode and said at least one heat sink have equal diameter dimensions;
   e. a buffer heat sink, positioned in a stacked configuration at the end of said stack; and
   f. a base heat sink positioned in a stacked configuration with said stack and said buffer heat sink, wherein the thermal conductivity characteristic and thermal capacity characteristic of said at least one heat sink is matched to the thermal conductivity characteristic and thermal capacity characteristic of said buffer heat sink and base heat sink combination.

* * * * *